United States Patent
Dewanz et al.

(10) Patent No.: US 8,107,309 B2
(45) Date of Patent: Jan. 31, 2012

(54) BIAS TEMPERATURE INSTABILITY-INFLUENCED STORAGE CELL

(75) Inventors: Douglas M. Dewanz, Rochester, MN (US); Peter T. Freiburger, Rochester, MN (US); David P. Paulsen, Dodge Center, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 12/505,102

(22) Filed: Jul. 17, 2009

(65) Prior Publication Data

US 2011/0013445 A1 Jan. 20, 2011

(51) Int. Cl.
*G11C 7/04* (2006.01)
(52) U.S. Cl. .................................. 365/211; 365/189.09
(58) Field of Classification Search .................. 365/211, 365/189.09
See application file for complete search history.

(56) References Cited

U.S. PATENT DOCUMENTS

| 7,092,273 B2 * | 8/2006 | Look | 365/104 |
| 7,835,196 B2 * | 11/2010 | Noda | 365/189.05 |
| 7,852,677 B2 * | 12/2010 | Orban et al. | 365/185.18 |

* cited by examiner

*Primary Examiner* — Hoai V Ho
*Assistant Examiner* — Kretelia Graham
(74) *Attorney, Agent, or Firm* — Bockhop & Associates LLC

(57) ABSTRACT

In a method of using a memory cell employing a field effect transistor (FET), the FET is heated to a first temperature sufficient to support bias temperature instability in the FET. The bit line is driven to a high voltage state. The word line is driven to a predetermined voltage state that causes bias temperature instability in the FET. The temperature, the high voltage state on the bit line and the predetermined voltage state on the word line are maintained for an amount of time sufficient to change a threshold voltage of the FET to a state where a desired data value is stored on the FET. The FET is cooled to a second temperature that is cooler than the first temperature after the amount of time has expired.

12 Claims, 2 Drawing Sheets

BIAS TEMPERATURE INSTABILITY-INFLUENCED STORAGE CELL

BACKGROUND OF THE INVENTION

1. Field of the Invention

The present invention relates to digital memory devices and, more specifically, to a non-volatile digital memory storage cell.

2. Description of the Prior Art

In digital systems, a non-volatile memory device is a device that is programmed to store a data value and then maintain that data value even after long periods in a powered-down state. Magnetic data recording disks are examples of non-volatile memory: data may be recorded on them and they will retain the data after long periods of storage without requiring any type of data refresh.

Certain types of solid state non-volatile memory devices store data in a permanent or near-permanent state. These types of non-volatile memory devices are often used to store the initial "boot-up" sequences of an operating system and programming code in single-application systems.

Many types of non-volatile memory devices are limited in data density as a result of the size of their constituent memory cells. One example of such memory cells employ e-fuses to set a permanent data state of each memory cell. To store a first value in the memory cell, the associated e-fuse is blown, to store a second value in the memory cell, the e-fuse is left intact. Such e-fuse based memory cells offer highly reliable permanent storage. However, they are bulky because the e-fuses are relatively large and they require large protection transistors. This limits the data density stored on an e-fused based memory device. Also, once an e-fuse is blown, then the bit stored on the memory cell is stored permanently and the device cannot be reprogrammed to store new data.

Negative bias temperature instability (NBTI) is a phenomenon that exists in p-type field effect transistors (PFET's) when they are subjected to heating for a given amount of time. NBTI is characterized by an increase in the threshold voltage and a decrease in drain current and transconductance in a PFET. Positive bias temperature instability (PBTI) is a similar phenomenon that exists in n-type field effect transistors (NFET's).

Therefore, there is a need for semi-permanent non-volatile memory that has a high data density.

SUMMARY OF THE INVENTION

The disadvantages of the prior art are overcome by the present invention which, in one aspect, is a method of using a memory cell employing a field effect transistor including a word line and a bit line. The field effect transistor is heated to a first predetermined temperature sufficient to support bias temperature instability in the field effect transistor. The bit line is driven to a high voltage state. The word line is driven to a predetermined voltage state that causes bias temperature instability in the field effect transistor. The first predetermined temperature, the high voltage state on the bit line and the predetermined voltage state on the word line are maintained for an amount of time sufficient to change a threshold voltage of the field effect transistor to a state where a desired data value is stored on the field effect transistor. The field effect transistor is cooled to a second predetermined temperature that is cooler than the first predetermined temperature after the amount of time has expired.

In another aspect, the invention is a programmable memory cell that includes at least one p-type field effect transistor that is configured to store a data element thereon and including a word line and a bit line. A heating mechanism is configured to heat the p-type field effect transistor to a first predetermined temperature that is sufficient to support negative bias temperature instability in the p-type field effect transistor. A mechanism is configured to drive the bit line to a high voltage state. A mechanism is configured to drive the word line to a low voltage state. When the first predetermined temperature, the high voltage state on the bit line and the low voltage state on the word line are maintained for an amount of time sufficient to change a threshold voltage of the p-type field effect transistor to a state, a desired data value is stored on the p-type field effect transistor.

In yet another aspect, the invention is a memory cell employing a p-type field effect transistor including a word line and a bit line. A means is provided for heating the p-type field effect transistor to a first predetermined temperature sufficient to support negative bias temperature instability in the p-type field effect transistor. A means is provided for driving the bit line to a high voltage state. A means is provided for driving the word line to a low voltage state. A means is provided for maintaining the first predetermined temperature, the high voltage state on the bit line and the low voltage state on the word line for an amount of time sufficient to change a threshold voltage of the p-type field effect transistor to a state where a desired data value is stored on the p-type field effect transistor These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
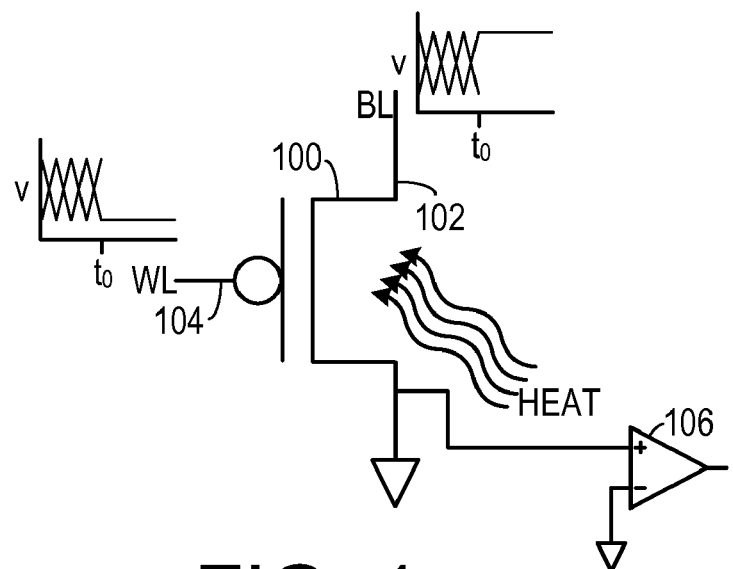
FIG. 1 is a schematic diagram of a negative bias temperature-influenced storage cell.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." As used herein, NBTI means negative bias temperature instability and PBTI means positive bias temperature instability.

One embodiment of this invention utilizes NBTI (negative-biased temperature instability) to modify the characteristics of a single PFET semi-permanently, making it possible to build a very dense storage array. Also, the threshold voltage shift caused by NBTI can be undone through a global or localized high voltage and high temperature anneal.

As shown in FIG. 1, in one embodiment, a p-type field effect transistor (PFET) 100 can be influenced by NBTI so as to store a data value. A "1" may be stored simply by doing nothing to the PFET 100, whereas a "0" may be stored by placing a low voltage on a word line (WL) coupled to the gate 104 of the PFET 100, placing a high voltage on a bit line (BL) coupled to the source 102 of the PFET 100 and heating the PFET 100 to a predetermined temperature of a predetermined amount of time.

If the PFET 100 is not affected by NBTI, it will conduct with a low gate voltage and store a "1." However, if a large enough NBTI shift is induced in the PFET 100, a low voltage at the gate 104 will not be able to turn the PFET 100 on and the source 102 will be read as a "0." As used with conventional memory circuits, a sense amplifier 106 can be used to distinguish between a programmed and a non-programmed PFET.

Figure 2A:
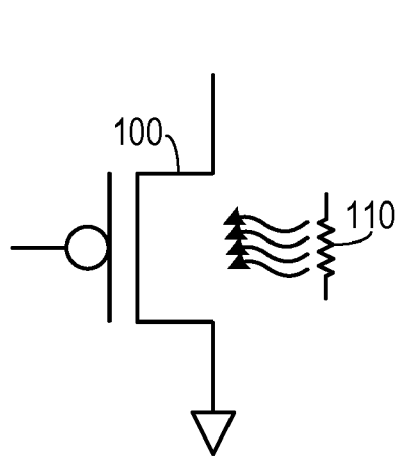
FIG. 2A is a schematic diagram showing a first method of heating a bias temperature-influenced storage cell.
Figure 2B:
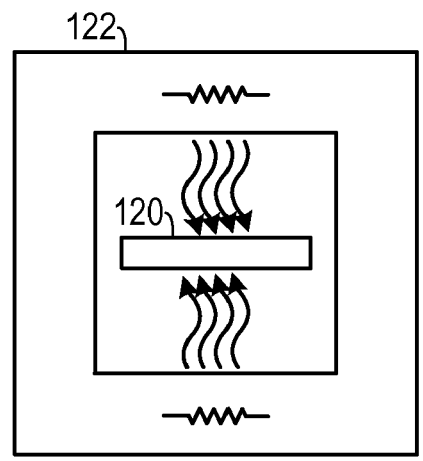
FIG. 2B is a schematic diagram showing a second method of heating a bias temperature-influenced storage cell.
Figure 2C:
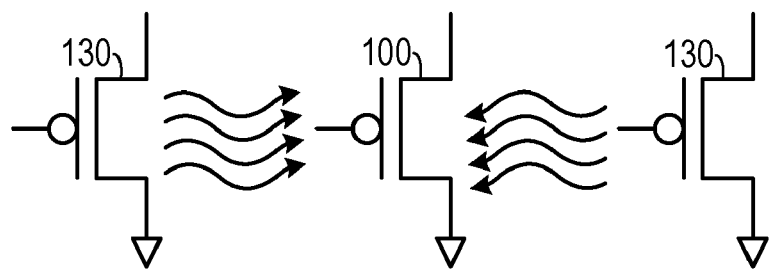
FIG. 2C is a schematic diagram showing a third method of heating a bias temperature-influenced storage cell.

The PFET 100 may be heated in one of several ways. For example, as shown in FIG. 2A, a heating element 110 (such as a resistor or other resistive heating element) may be disposed next to the PFET 100 and activated (for example, by driving a current therethrough) when the PFET is to be heated. In another example, as shown in FIG. 2B, a plurality of field effect transistors in a memory device 120 (which may include PFET's) can be heated simultaneously in a heating chamber 122, such as an oven, during an initial "burn in" of the memory device 120. In yet another example, as shown in FIG. 2C, transistors 130 surrounding the PFET on which a data value is to be stored may be activated so as to generate heat.

Figure 3:
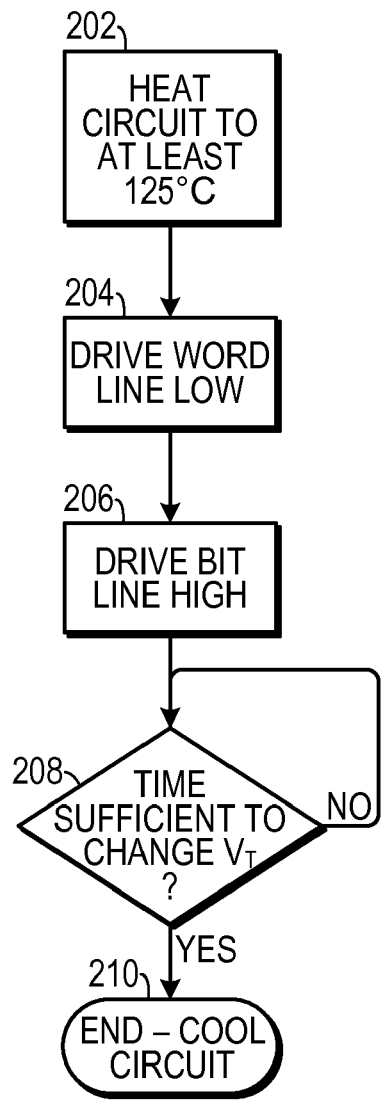
FIG. 3 is a flow chart showing a method of storing data in a bias temperature-influenced storage cell.

A shown in FIG. 3, to store a data value on a PFET, the circuit is initially heated 202 to the necessary temperature (such as 125° C.). The word line is driven to a low voltage 204 and the bit line is driven to a high voltage 206. The temperature and the states of the word line and the bit line are maintained for an amount of time sufficient to cause the threshold voltage ($V_T$) to shift to the point where the correct data value will be stored thereon 208. In one embodiment, this amount of time is at least 20 minutes. Then the circuit is allowed to cool 210, after which the correct data value is stored on the PFET.

The NBTI influenced storage cell is an extremely dense non-volatile storage device. It consists of a single PFET whose $V_T$ has been shifted by the NBTI process if it is to store a '0' or it remains untouched by NBTI if it is to store a '1.' The main idea is that NBTI can induce enough of a $V_T$ shift to be detected by a sense amp (in some embodiments, the $V_T$ shift is somewhere on the order of 500 mV). This shift can occur by placing the PFET in a conductive state at high voltage. This high voltage combined with local heating will cause the $V_T$ to move after a relatively long duration. The change is then permanent unless the PFET is placed in the non-conductive state at high temperature and high voltage. By shifting the $V_T$ by 500 mV or more, it is possible to move the $V_T$ of the device above the nominal operating voltage thereby eliminating the possibility that it can conduct any current at all.

Figure 4:
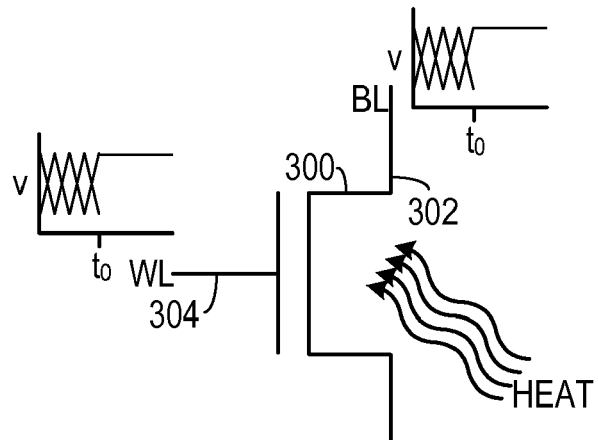
FIG. 4 is a schematic diagram of a positive bias temperature-influenced storage cell.

As shown in FIG. 4, another embodiment uses an n-type field effect transistor (NFET) 300 as a storage element. In this embodiment, the NFET 300 is heated while driving both the world line 304 and the bit line 302 to a high voltage state. This embodiment uses positive bias temperature instability to change the threshold voltage of the NFET 300 to the point where the desired value is stored on the NFET 300. This embodiment can also be used to make an extremely dense non-volatile storage device.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of using a memory cell employing a field effect transistor including a word line and a bit line, comprising the actions of:
   a. heating the field effect transistor to a first predetermined temperature sufficient to support a bias temperature instability in the field effect transistor;
   b. driving the bit line to a high voltage state;
   c. driving the word line to a predetermined voltage state that causes the bias temperature instability in the field effect transistor;
   d. maintaining the first predetermined temperature, the high voltage state on the bit line and the predetermined voltage state on the word line for an amount of time sufficient to change a threshold voltage of the field effect transistor to a state where a desired data value is stored on the field effect transistor; and
   e. cooling the field effect transistor to a second predetermined temperature that is cooler than the first predetermined temperature after the amount of time has expired.

2. The method of claim 1, wherein the field effect transistor comprises a p-type field effect transistor and wherein the bias temperature instability is a negative bias temperature instability and wherein the predetermined voltage state comprises a low voltage state.

3. The method of claim 1, wherein the field effect transistor comprises an n-type field effect transistor and wherein the bias temperature instability is a positive bias temperature instability and wherein the predetermined voltage state comprises a high voltage state.

4. The method of claim 1, wherein the heating step comprises the action of driving current through at least one electronic element adjacent to the field effect transistor.

5. The method of claim 4, wherein the electronic element comprises a heating element.

6. The method of claim 5, wherein the heating element comprises a resistor.

7. The method of claim 4, wherein the electronic element comprises at least one transistor.

8. The method of claim 1, wherein the heating step comprises the action of placing the field effect transistor in an oven during a programming phase.

9. A programmable memory cell, comprising
   a. at least one p-type field effect transistor configured to store a data element thereon and including a source and a gate;
   b. a heating mechanism configured to heat the p-type field effect transistor to a first predetermined temperature that is sufficient to support negative bias temperature instability in the p-type field effect transistor;
   c. a bit line coupled to the source and configured to be driven to a high voltage state;
   d. a word line coupled to the gate and configured to be driven to a low voltage state;
   so that when the first predetermined temperature, the high voltage state on the bit line and the low voltage state on the word line is maintained for an amount of time sufficient to change a threshold voltage of the p-type field effect transistor to a state, a desired data value is stored on the p-type field effect transistor.

10. The programmable memory cell of claim 9, wherein the heating mechanism comprises a resistor.

11. The programmable memory cell of claim 9, wherein the heating mechanism comprises at least one transistor disposed adjacent to the at least one p-type field effect transistor and configured to heat the at least one p-type field effect transistor when a current is applied thereto.

12. The programmable memory cell of claim 9, wherein the heating mechanism comprises an oven configured to heat the at least one p-type field effect transistor during a programming phase.

* * * * *